United States Patent
Volke et al.

(10) Patent No.: US 10,224,920 B2
(45) Date of Patent: Mar. 5, 2019

(54) SOFT SHUTDOWN MODULAR CIRCUITRY FOR POWER SEMICONDUCTOR SWITCHES

(71) Applicant: Power Integrations, Inc., San Jose, CA (US)

(72) Inventors: Andreas Volke, Soest (DE); Karsten Fink, Werl (DE)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 16/019,345

(22) Filed: Jun. 26, 2018

(65) Prior Publication Data

US 2018/0309433 A1    Oct. 25, 2018

Related U.S. Application Data

(63) Continuation of application No. 15/416,787, filed on Jan. 26, 2017, now Pat. No. 10,038,434.

(30) Foreign Application Priority Data

Apr. 6, 2016   (EP) ..................... 16164054

(51) Int. Cl.
*H03K 17/081*   (2006.01)
*H02M 1/088*   (2006.01)
(Continued)

(52) U.S. Cl.
CPC .......... *H03K 17/081* (2013.01); *H02M 1/088* (2013.01); *H03K 17/082* (2013.01); *H03K 17/166* (2013.01); *H03K 2217/0027* (2013.01)

(58) Field of Classification Search
CPC ............ H02M 1/32; H02M 1/36; H02M 1/08; H02M 1/088; H02M 2001/0009;
(Continued)

(56) References Cited

U.S. PATENT DOCUMENTS

| | | | |
|---|---|---|---|
| 5,063,303 | A | 11/1991 | Sackman et al. |
| 6,037,720 | A | 3/2000 | Wong et al. |

(Continued)

FOREIGN PATENT DOCUMENTS

| | | |
|---|---|---|
| JP | 2012257421 A | 12/2012 |
| JP | 2015201980 A | 11/2015 |
| JP | 2015202034 A | 11/2015 |

OTHER PUBLICATIONS

European Search Report dated Oct. 4, 2016 for European Application No. 16164054.5, filed Apr. 6, 2016, 4 pages.

(Continued)

*Primary Examiner* — Gustavo Rosario Benitez
(74) *Attorney, Agent, or Firm* — Christensen O'Connor Johnson Kindness PLLC

(57) ABSTRACT

Circuitry for soft shutdown of a power switch and a power converters that includes circuitry for soft shutdown are described. In one aspect, circuitry for soft shutdown of a power switch includes a sense input to be coupled to a power switch receive a signal representative of current passing through the power switch, a comparator to compare the signal with an overcurrent threshold indicative of an overcurrent condition of the power switch and to output a triggering signal in response to the comparison indicating the overcurrent condition, and a gating transistor to be coupled to a control terminal of the power switch, the gating transistor configured to divert a portion of a drive signal away from the control terminal of the power switch in response to the triggering signal.

10 Claims, 7 Drawing Sheets

(51) Int. Cl.
*H03K 17/082* (2006.01)
*H03K 17/16* (2006.01)

(58) Field of Classification Search
CPC ...... H03K 17/00; H03K 17/567; H03K 17/08; H03K 17/687; H03K 17/0812; H03K 17/26; H03K 17/28; H03K 17/0828; H03K 17/168; H03K 17/18
See application file for complete search history.

(56) References Cited

U.S. PATENT DOCUMENTS

| | | |
|---|---|---|
| 6,859,087 B2 | 2/2005 | Galli et al. |
| 7,636,247 B2 | 12/2009 | Disney |
| 8,503,146 B1 | 8/2013 | Shekhawat |
| 2004/0252435 A1 | 12/2004 | Ishikawa et al. |
| 2005/0206438 A1 | 9/2005 | Higashi |
| 2009/0230938 A1* | 9/2009 | Sakurai ................. H02M 7/538 323/283 |
| 2009/0273324 A1 | 11/2009 | Okamoto et al. |
| 2010/0090755 A1 | 4/2010 | Ng et al. |
| 2012/0229942 A1 | 9/2012 | Hussein et al. |
| 2015/0035585 A1* | 2/2015 | Mari Curbelo ........ H03K 17/28 327/393 |
| 2015/0263514 A1 | 9/2015 | Koishi et al. |
| 2015/0311692 A1 | 10/2015 | Hiyama |
| 2015/0318850 A1 | 11/2015 | Hiyama |
| 2016/0126718 A1 | 5/2016 | Naito et al. |
| 2016/0134085 A1 | 5/2016 | Obe et al. |
| 2017/0207650 A1* | 7/2017 | Miyazawa ............ H02J 7/0068 |
| 2017/0214313 A1* | 7/2017 | Kikuchi ................ H02H 3/093 |

OTHER PUBLICATIONS

European Office Action dated Nov. 15, 2016 for European Application No. 16164054.5, filed Apr. 6, 2016, 10 pages.

EPO Summons to Attend Oral Proceedings mailed Feb. 28, 2018 for European Application No. 16164054.5, filed Apr. 6, 2016, 10 pages.

Decision to Refuse a European Patent Application dated Sep. 21, 2018, for European Application No. 16164054.5, filed Apr. 6, 2016, 34 pages.

* cited by examiner

SOFT SHUTDOWN MODULAR CIRCUITRY FOR POWER SEMICONDUCTOR SWITCHES

REFERENCE TO RELATED APPLICATIONS

This application is a continuation of U.S. application Ser. No. 15/416,787, filed Jan. 26, 2017, which claims priority to European Patent (EP) Application No. 16164054.5, filed on Apr. 6, 2016, both of which are hereby incorporated by reference.

TECHNICAL FIELD

This document relates to soft shutdown circuitry for power semiconductor switches, e.g., for power semiconductor switches such as SiC MOSFETs, Si IGBTs, and power MOSFET switches.

BACKGROUND

Semiconductor power switches are used in a variety of power applications, including, e.g., power conversion, power generation, and power transmission. Power switches are specifically designed to survive the steady-state conditions in such power applications. For example, power switches are designed to withstand relatively large potential differences between the main terminals (e.g., drain-to-source or collector-to-emitter voltages) in the OFF state and to conduct relatively large currents (e.g., drain or collector currents) in the ON state while dissipating relatively low power.

Power switches are also specifically designed to transition between a more conductive ON state and a less conductive OFF state in such power applications. Because of the relatively high currents and/or voltages in power applications, these transitions often bear an increased risk of failure for the power switch and the circuitry coupled thereto. For example, leads, wires, components, and circuitry that are coupled to a power switch often have a non-negligible intrinsic inductances. In the event of a large, rapid change in voltage—such as the voltage changes associated with the transition of a power switch between an ON state and an OFF state—such inductances can cause voltage spikes that are capable of harm.

In order to reduce the risk of harm associated with large, rapid changes in voltage, many semiconductor power switch drivers and controllers provide "soft" shutdown functionality. In particular, the potential on the control terminal (e.g., gate or base terminal) of a semiconductor switch is changed relatively slowly in order to reduce the rate of change of the current conducted by the power switch, as well as the rate of change of the potential difference across the main terminals of the power switch. Voltage spikes due to intrinsic inductances can be reduced or avoided.

Several approaches have been used to provide soft shutdown functionality for semiconductor switches. Many of these approaches can be treated as a variable-resistance element that is coupled in series with the control terminal of the power semiconductor switch. A closed loop control circuit is coupled to sense a short circuit or other overcurrent condition and adjust the resistance of the variable-resistance element in response. By adjusting this resistance, the magnitude of the drive signal that is coupled into the control terminal is adjusted to ensure that shutdown proceeds sufficiently slowly.

Often, short circuit or other overcurrent conditions are sensed using desaturation fault detection circuitry. As soon as a short circuit or other overcurrent condition occurs, the current between the main terminals increases very rapidly. The rapid increase in current between the main terminals may lead to a voltage across the main terminals that exceeds the expected voltage across those terminals at saturation. This high voltage can be sensed and used to trigger soft shutdown functionality.

Although soft shutdown functionality has been implemented successfully in certain operational conditions, the technical requirements for soft shutdown increase as the rate of switching and the magnitude of the switched voltages increase. For example, modern power modules—such as those implemented in part (e.g., hybrid modules, Si IGBT+ SiC Schottky diodes) or in whole (e.g., SiC MOSFET+SiC Schottky diodes) with high-bandwidth semiconductor materials—can switch several 100's of kilowatts at frequencies in the range of 30-100 kHz or more. Despite the relatively low power losses and relatively high power densities provided by such modern power modules, even these power modules are able to endure short circuit and other overcurrent conditions for relatively short time periods. For example, the short circuit safe operating area (SCSOA) time of a modern power module may be a few microseconds. Further, avalanche operation may not be allowed.

SUMMARY OF THE INVENTION

This document describes soft shutdown circuitry for power semiconductor switches.

In a first aspect, circuitry for soft shutdown of a power switch includes a sense input to be coupled to a power switch receive a signal representative of current passing through the power switch, a comparator to compare the signal with an overcurrent threshold indicative of an overcurrent condition of the power switch and to output a triggering signal in response to the comparison indicating the overcurrent condition, and a gating transistor to be coupled to a control terminal of the power switch, the gating transistor configured to divert a portion of a drive signal away from the control terminal of the power switch in response to the triggering signal.

This and other aspects can include one or more of the following features. The sense input can be a current sense input. The signal representative of current passing through the power switch can be a current sense signal. The sense input can be a voltage sense input. The signal representative of current passing through the power switch can be a voltage sense signal representative of the potential difference between main terminals of the power switch.

The circuitry for soft shutdown can also include an error signal output, and latch circuitry configured to latch an error signal output on the error signal output into an error state for a duration. The circuitry for soft shutdown can also include a coupling between the latch circuitry and a control terminal of the gating transistor. The coupling can be configured so that the gating transistor is latched to divert the portion of the drive signal away from the control terminal for the duration. The latch circuitry can be a D-type flip flop. The circuitry for soft shutdown can also include a duration input coupled to receive a signal representative of the duration. The circuitry for soft shutdown can also include an overcurrent threshold adjust input coupled to receive a signal to adjust the overcurrent threshold. The overcurrent threshold adjust input can be a terminal coupled to the comparator.

The circuitry for soft shutdown of a power switch can be modular. For example, the circuitry for soft shutdown can be packaged in an integrated circuit package that is discrete from the power switch and driver circuitry that outputs the drive signal. As another example, the circuitry for soft shutdown can be assembled on a circuit board that is discrete from the power switch and driver circuitry that outputs the drive signal. The circuitry for soft shutdown can be used to form the modular soft shutdown circuitry of the second aspect.

In a second aspect, a power converter includes a power switch having a control terminal and a first and second main terminals, driver circuitry coupled to output a drive signal to drive the control terminal of the power switch so that the power switch switches between a first, more conductive ON state and a second, less conductive OFF state, a switching controller coupled to control the driving of the control terminal by the driver circuitry, and modular soft shutdown circuitry coupled to at least one of the main terminals and to the control terminal of the power switch. The modular soft shutdown circuitry is configured to sense an overcurrent condition in the power switch and—in response to the sensing of the overcurrent condition—to slow the transition of the power switch from the ON state into the OFF state.

This and other aspects can include one or more of the following features. The modular soft shutdown circuitry can be the circuitry for soft shutdown of the first aspect, including one or more of the features thereof.

The modular soft shutdown circuitry can be packaged in an integrated circuit package that is discrete from the power switch, the driver circuitry, and the switching controller. The modular soft shutdown circuitry can be assembled on a circuit board that is discrete from the power switch, the driver circuitry, and the switching controller. The modular soft shutdown circuitry can be housed in a housing. The power switch, the driver circuitry, and the switching controller can be external to the housing.

The drive signal can pass through the modular soft shutdown circuitry. One of the driver circuitry and the switching controller can include an error input and is configured to respond to an error signal on the error input by transitioning the power switch into the OFF state. The modular soft shutdown circuitry can include an error signal output coupled to the error input. The modular soft shutdown circuitry can be configured to output a latched error signal for a duration in response to the sensing of the overcurrent condition. The modular soft shutdown circuitry can include a duration input coupled to receive a signal representative of the duration. The latched error signal can also be coupled to divert the portion of the drive signal output from the driver circuitry away from the control terminal for the duration. The error input can be coupled to desaturation fault detection circuitry. The power converter can include a plurality of power switches that are coupled in parallel. The power switch can include a tap and the modular soft shutdown circuitry is coupled to the at least one of the main terminals via the tap. The power switch can be a silicon carbide (SiC) power switch.

These and other aspects can be implemented to achieve one or more of the following advantages. For example, in some implementations, the soft shutdown circuitry is modular in that the circuitry is configured as a discrete module that can be combined with a variety of different power switches and switching controllers. The power switches and switching controllers can themselves be either individual elements (e.g., separate integrated circuits) or combined elements (such as integrated circuit controllers and power switches or power modules that include both power switches and controllers). The soft shutdown functionality described in the present document can be combined with power switch and/or switching controller circuitry that were not fabricated with internal soft shutdown circuitry.

In some implementations, one or more operational characteristics of the soft shutdown circuitry can be adjustable post-fabrication. For example, in some implementations, one or more thresholds for detection of an overcurrent event can be adjustable. As another example, in some implementations, the duration of the soft shutdown period can be adjustable. In another example, both a threshold for detection and the duration of the soft shutdown period can be adjustable. In these cases, the operational characteristics of the modular soft shutdown circuitry can be tailored to a variety of different operational contexts.

In some implementations, the soft shutdown circuitry senses a current flowing into or out of one of the main terminals of the power switch—rather than a voltage across those main terminals—to identify a short circuit or other overcurrent condition and triggers soft shutdown. By sensing such a current, the response time of the soft shutdown circuitry can be reduced and even sensitive high-bandwidth semiconductor devices can be protected. For example, in some implementations, the soft shutdown circuitry may respond to short-circuits and other overcurrents in less than two microseconds.

In some implementations, the soft shutdown functionality is implemented by modulating a controlled impedance (e.g., an auxiliary switch) through the soft-shutdown circuitry that is coupled to the control terminal of the power switch to provide a shunt path for a controlled gate discharge of the power semiconductor switch and divert the charge from the control terminal of the power semiconductor switch. In some cases, the auxiliary switch is a MOSFET that is activated to shunt the drive signal from the control terminal of the power switch. For example, the auxiliary switch can be driven to clamp (pull down) and discharge the gate of the power semiconductor switch at a potential set relative to a reference potential.

BRIEF DESCRIPTION OF THE DRAWINGS

Non-limiting and non-exhaustive exemplary embodiments of the invention are described with reference to the following figures, wherein the same reference symbols relate to the same components in different figures, where not specified otherwise.

FIG. 4A is a scope capture illustrating the turn-off transition of a power switch without soft shutdown circuitry at the presence of an over current as a function of time.

FIG. 4B is a scope capture illustrating the turn-off transition of a power switch with soft shutdown circuitry at the presence of an over current as a function of time.

DETAILED DESCRIPTION

Figure 1A:
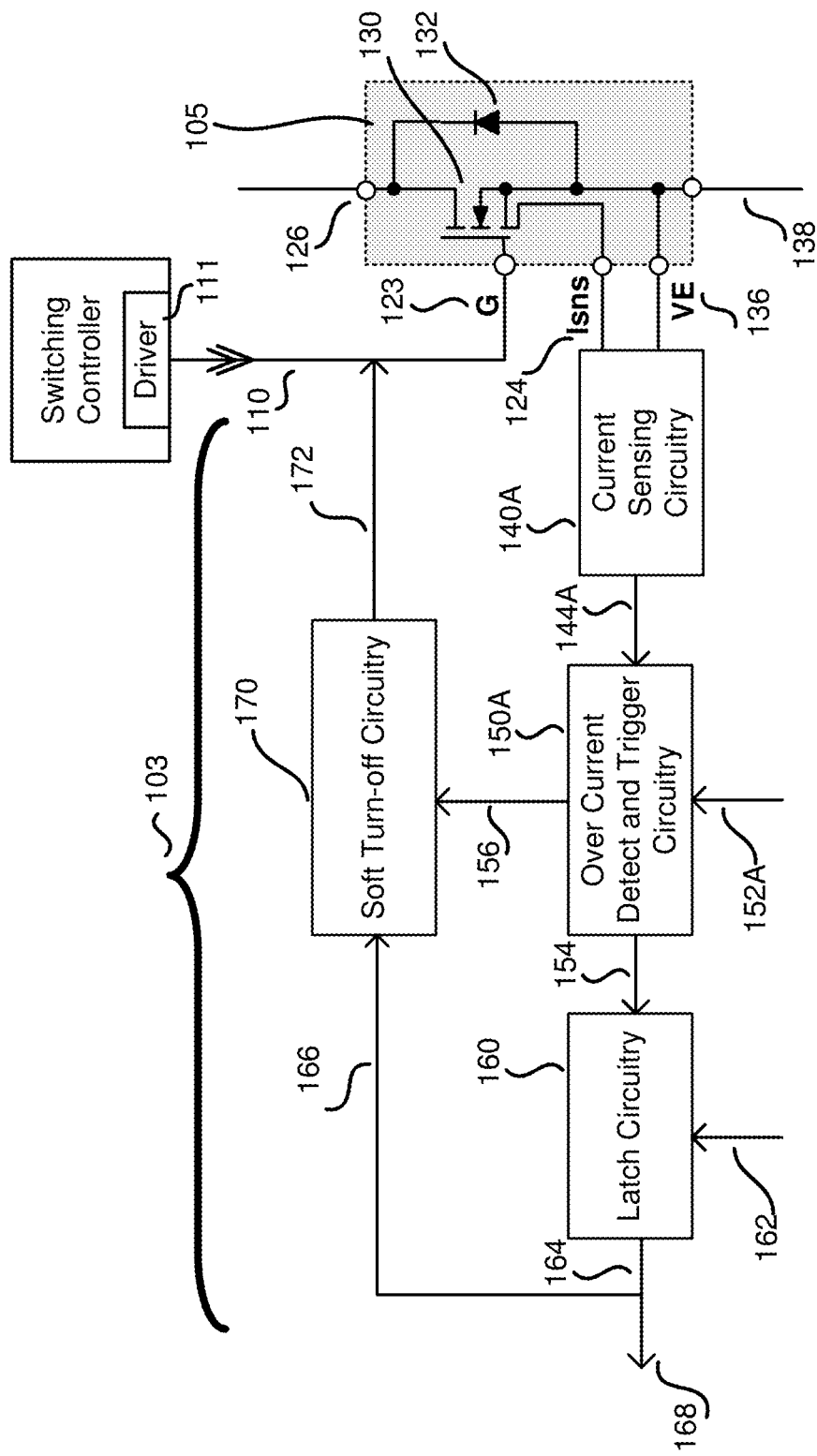
FIG. 1A is a schematic representation of soft shutdown block diagram for controlling the turn-OFF of a power semiconductor switch with current sensing.

Numerous details are given in the description below to enable a far-reaching understanding of the present invention. However, it is clear to a person skilled in the art that the specific details are not necessary for implementing the present invention. Known apparatuses and methods are not outlined in detail at another point in order to not unnecessarily hinder understanding of the present invention.

In the present description, a reference to "an implementation", "a configuration", "an example" or "example" means that a specific feature, structure or property which is described in conjunction with this embodiment is included in at least one embodiment of the present invention. Thus, the phrases "in one implementation", "in one embodiment", "one example" or "in one example" at different points in this description do not necessarily all relate to the same embodiment or the same example.

In addition, the specific features, structures or properties can be combined in any desired suitable combinations and/or sub combinations in one or more embodiments or examples. Particular features, structures or properties can be included in an integrated circuit, in an electronic circuit, in circuit logic or in other suitable components which provide the described functionality. Furthermore, reference will be made to the fact that the drawings are used for explanatory purposes for a person skilled in the art and that the drawings are not necessarily illustrated true to scale.

FIG. 1 is a schematic representation of soft shutdown circuit block (module) 103 for controlling the turn-OFF of a power semiconductor switch 130 in a power switching integrated circuit (module) 105.

In the illustrated implementation, power semiconductor switch 130 is an n-channel MOSFET device with an intrinsic antiparallel diode 132 disposed in a power switching integrated circuit 105. Power semiconductor switch 130 can be implemented in part or in whole with high-bandwidth semiconductor materials, e.g., SiC. In other implementations, power semiconductor switch 130 can be, e.g., as a p-channel device, as an insulated gate bipolar transistor IGBT, and/or as a junction field effect transistor device. In some implementations, power semiconductor switch 130 is a collection of multiple semiconductor devices that are paralleled or stacked.

Power switching integrated circuit 105 includes main terminals (i.e., drain terminal 126 and source terminal 138), a source reference terminal (i.e., VE 136, a control terminal (i.e., gate terminal G1 123), and a current sense terminal Isns 124. In the illustrated implementation of power switching integrated circuit 105, source reference terminal VE 136 is a sense terminal that is to be coupled, e.g., to driver circuitry that senses voltage or current characteristics of the power switch source. Main source terminal 138 is a terminal that conducts the majority of the load current that passes through the power switching integrated circuit 105. Other examples of power switching integrated circuits 105 may include power modules formed using IGBT power switches.

Current sense terminal Isns 124 is coupled to output a current sense signal representing current flowing through power semiconductor switch 130. For example, in some implementations, current sense terminal Isns 124 can be coupled to a tap element of the power semiconductor switch 130 that provides a voltage proportional to the current flowing between the main terminals of power semiconductor switch 130. Examples of such a tap element are described, e.g., in U.S. Pat. No. 7,636,247. In other implementations, a current sense terminal can be coupled to an internal or external resistor in the path of switch current (known by someone skilled in the art as current sense resistor). The voltage dropped across such a current sense resistor can indicate the current flowing between the main terminals of power semiconductor switch 130.

Soft shutdown circuitry 100 includes current sensing circuitry 140A, trigger circuitry 150A, latch circuitry 160, and soft turn-off circuitry block 170.

Current sensing circuitry 140A is circuitry that is coupled to sense a current flowing into or out of one of the main terminals of power semiconductor switch 130. In the illustrated implementation, current sensing circuitry 140A is coupled to current sense terminal Isns 124 to receive a current signal or a voltage signal that is proportional to the current flowing between the main terminals of power semiconductor switch 130. In the case of sensed voltage signal, the sensed voltage signal is referenced to the potential VE of source sense terminal 136, which is also coupled to current sensing circuitry 140A.

Current sensing circuitry 140A generates signal output 144A and outputs it to over current detect and trigger circuitry 150A. Signal output 144A can be, e.g., a voltage signal referenced to the controller reference ground potential (COM 295 in FIG. 2).

The over current detect and trigger circuitry 150A also includes an overcurrent threshold adjust input 152A. Overcurrent threshold adjust input 152A receives a signal representative of the level at which an overcurrent is to be identified. The over current detect and trigger circuitry 150A generates trigger activation signals 154 and 156. These signals indicate whether the sensed current has exceeded the adjustable overcurrent threshold set by the signal on overcurrent threshold adjust input 152A. In the event that the sensed current has exceeded the adjustable overcurrent threshold, the trigger activation signals 154 and 156 trigger various actions. The output signal 156 is particularly beneficial when used in conjunction with power switches that have short short-circuit withstand times. Examples of such power switches include SiC MOSFETs, which typically have a short circuit withstand time of around 2 µs. However, output 156 is not essential, especially for power switches that have longer short-circuit times. Examples of such power switches include IGBTs, which typically have short circuit withstand times of around 10 µs.

Over current detect and trigger circuitry 150A is coupled to trigger responses by both latch circuitry 160 and soft turn-off circuitry block 170 in response to comparison of the received sensed current signal 144A and the adjustable overcurrent threshold input signal 152A. Trigger circuitry 150A can generate one or more output signals 154, 156 to trigger appropriate responses by latch circuitry 160 and soft turn-off circuitry block 170. In particular, over current detect and trigger circuitry 150A includes a first output signal 156 that is coupled to trigger soft turn-off circuitry block 170 and a second output signal 154 that is coupled to trigger latch circuitry block 160.

Soft turn-off circuitry block 170 is coupled to decrease the rate at which switch 130 transitions from a more conductive ON state to a less conductive OFF state in response to being triggered by over current detect and trigger circuitry 150A. Soft turn-off circuitry block 170 includes an output signal 172 coupled to gate terminal G1 123 to modulate a drive signal 110 received from the driver 111 of a pulse-width modulation (PWM) or other switching controller. For example, the driver 111 can be a gate driver that does not include a soft shutdown function.

Soft turn-off circuitry block 170 modulates drive signal 110 by slowing the rate of change of the current or voltage that drives the transition from the ON state to the OFF state. For example, when the transition from the ON state to the OFF state is driven by the potential on gate terminal G1 123 being driven from a higher level to a lower level (such as would be the case with a voltage-controlled power switch 130), the soft turn-off circuitry block 170 can modulate the drive signal by controlling the magnitude of the current flow from gate terminal G1 123 into the driver 111 of the switching controller. In other word the soft turn-off circuitry block 170 can modulate the drive signal by diverting the current flow between the gate terminal G1 123 and the driver 111 by pulling down and discharging the gate capacitance of the power switch 130 in a controlled rate.

Latch circuitry 160 is circuitry that is coupled to latch the driver 111 of the switching controller into a state that drives power switch 130 into the OFF state. Latch circuitry 160 includes an output signal 164 that is coupled to an input of the drive circuitry and/or switching controller and an input signal 162 that is coupled to receive a signal representative of the duration of the soft shutdown period (i.e., the time period over which the drive signal is maintained in a state that drives power switch 130 into the OFF state). For example, input signal 162 can be coupled to a timing capacitor that resets the latch circuitry (i.e., capacitor 281 shown in FIG. 2). The drive circuitry can be a separate unit, e.g., part of a gate driver unit that does not include a soft shutdown function.

In some implementations, output signal 164 of latch circuitry 160 is coupled to cause a hard turn-off of power semiconductor switch 130. In general, a hard turn-off is subject only to the intrinsic delays associated with signal propagation and response to and from driver 111 and/or switching controller. For example, a hard turn-off can be subject to an intrinsic delay of, e.g., 1.5 microseconds.

In some implementations, output signal 164 of latch circuitry 160 is coupled to a desaturation voltage input of a driver 111 and/or switching controller. In particular, some standard/generic drivers and/or switching controllers include a terminal that is to be coupled to desaturation fault detection circuitry. In some datasheets, this terminal may be designated the "DESAT", "FAULT" or "VCE" terminal. Latch circuitry 160 can output a signal 164 that presents a desaturation fault in a power switch and lasts for the entire duration of the soft shutdown period, leading the driver 111 and/or switching controller to maintain drive signal 110 in a state that drives power switch 130 into the OFF state.

Figure 1B:
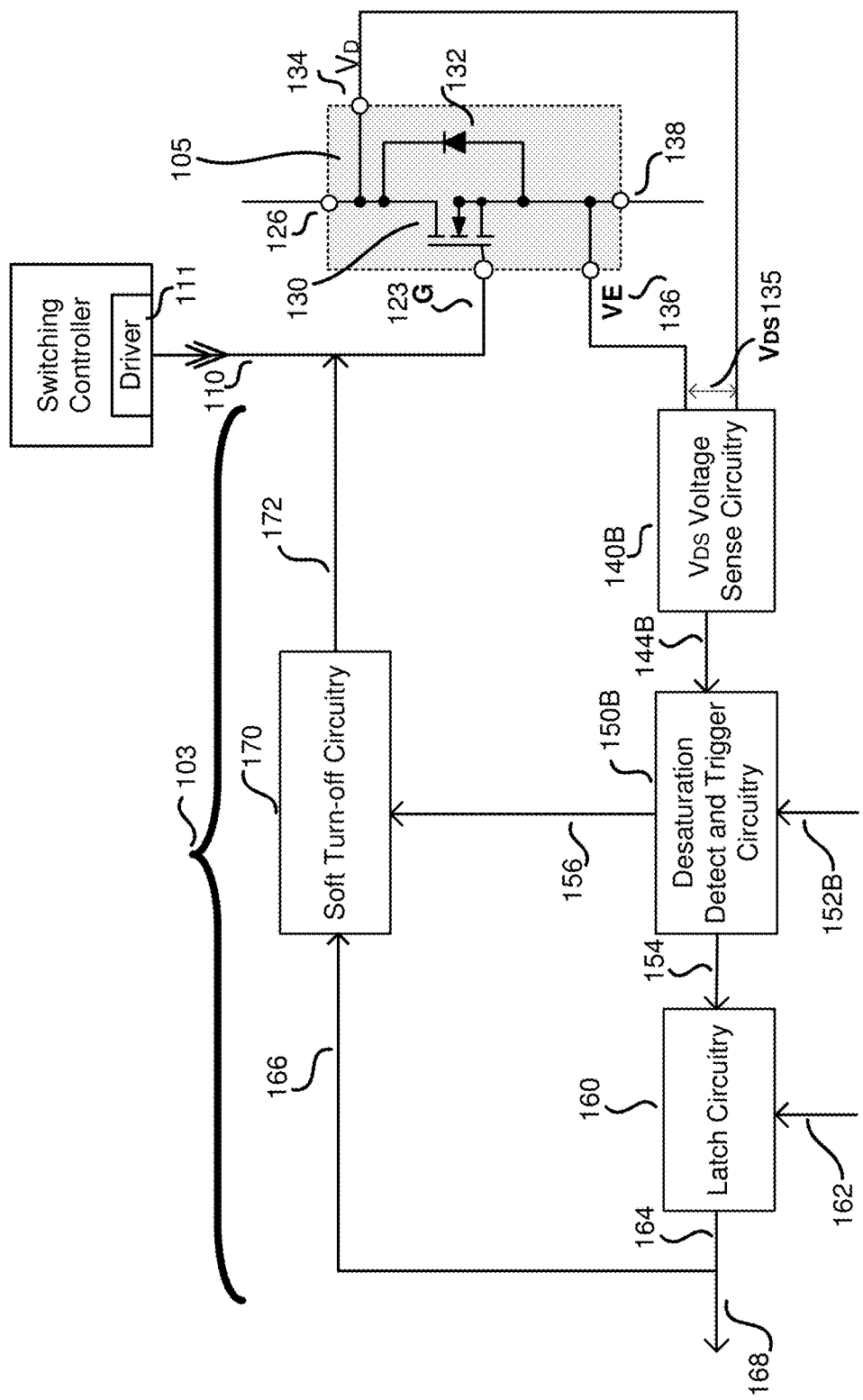
FIG. 1B is a schematic representation of soft shutdown block diagram for controlling the turn-OFF of a power semiconductor switch with voltage sensing.

FIG. 1B is a schematic of a related soft shutdown circuit block (module) 103 of FIG. 1A for controlling the turn-OFF of a power semiconductor switch 130 in a power switching integrated circuit (module) 105. In contrast with FIG. 1A, instead of current sensing circuitry 140A that senses the current through the power switch via Isns terminal 124, the soft shutdown circuit block (module) 103 of FIG. 1B includes a $V_{DS}$ voltage sensing circuitry 140B. $V_{DS}$ voltage sensing circuitry 140B senses the drain voltage (or the collector voltage, e.g., in the case of IGBT) via a terminal $V_D$ 134 that is referenced to source terminal VE 136. The potential difference between terminal $V_D$ 134 and source terminal VE 136 is $V_{DS}$ 135, which is used by $V_{DS}$ voltage sense circuitry 140B to generate desaturation voltage sense signal 144B. Desaturation voltage sense signal 144B is output to desaturation detect and trigger circuitry 150B. Desaturation detect and trigger circuitry block 150B also receives a reference threshold signal 152B that is compared with the desaturation voltage sense signal 144B to generate trigger signals 154 and 156. These trigger signals have the same effect as in FIG. 1A. Soft turn-off circuitry 170 and latch circuitry 160 in FIG. 1B are the same as FIG. 1A.

Figure 2A:
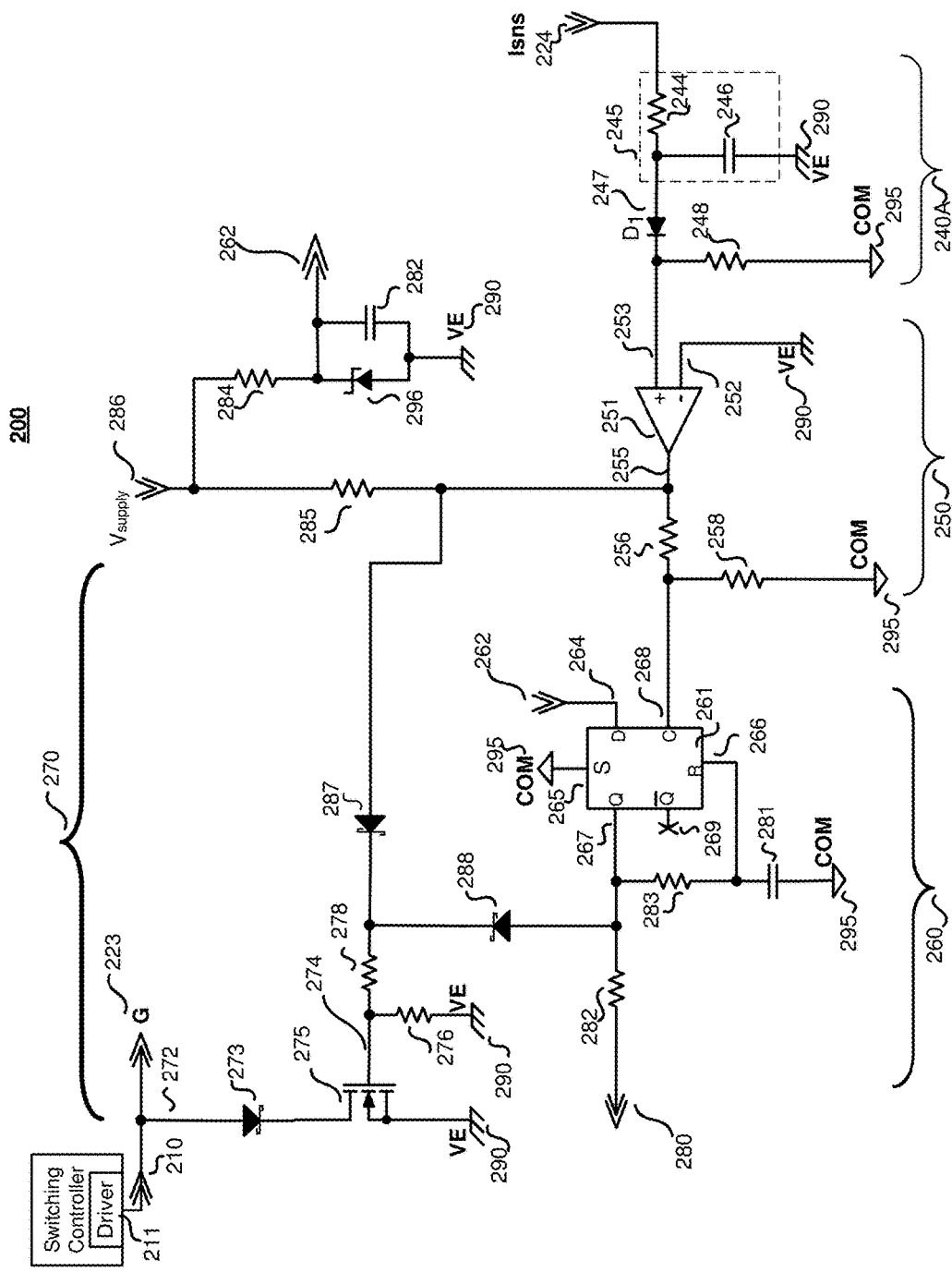
FIG. 2A is a schematic representation of one implementation of soft shutdown circuitry for controlling the turn-OFF of a power semiconductor switch by detecting fault condition trough the switch current.

FIG. 2A is a schematic representation of one implementation of soft shutdown circuitry (module) 200 for controlling the turn-off of a power semiconductor switch by sensing the switch current. Soft shutdown circuitry (module) 200 in FIG. 2A includes current sensing circuitry 240, trigger circuitry 250, latch circuitry 260, and soft turn-off circuitry 270.

In the illustrated implementation, current sensing circuitry 240 includes a low pass filter 245, a buffering diode D1 247 and a resistor 248. Low pass filter 245 includes a resistance 244 coupled to current sense terminal Isns 224 and a capacitance 246 that is coupled to the power semiconductor source reference potential VE 290. Low pass filter 245 filters out high frequency noise components from a current sense signal received on current sense terminal Isns 224 (124 in FIG. 1). Buffering diode 247 and resistor 248 are coupled to a non-inverting input 253 of comparator 251. Resistor 248 is also coupled to the controller ground reference COM 295.

Comparator 251 in section (circuit block) 250 detects over current and triggers soft turn off of the power semiconductor switch. In particular, in addition to non-inverting input 253, comparator 251 also includes an inverting input 252 and an output 255. Inverting input terminal 252 is coupled to the power semiconductor source reference potential VE 290 representative of the level at which an overcurrent is to be identified. In FIG. 1 it is represented by input 152, which receives the overcurrent threshold adjust signal. Comparator 251 compares the signal on input 252 with the (diode-dropped and low-pass filtered) current sense signal from Isns 224 to output a signal on trigger activation signal output 255 indicating whether the sensed current has exceeded the adjustable overcurrent threshold. In some implementations, comparator 251 is an open collector comparator circuit.

In the illustrated implementation, so long as the overcurrent threshold signal on inverting input 252 is higher than the (diode-dropped and low-pass filtered) current sense signal on non-inverting input 253, comparator 251 outputs a low signal on trigger activation signal output 255. In this case, trigger activation signal output 255 activates neither latch circuitry 261 in section 260 nor soft turn-off circuitry in section 270. On the other hand, should the (diode-dropped and low-pass filtered) current sense signal on non-inverting input 253 be higher that the overcurrent threshold signal on inverting input 252, comparator 251 allows DC supply voltage $V_{supply}$ 286 to pull up activation signal output 255 through resistor 285 to activate both latch circuitry in circuit section 260 and soft turn-off circuit section 270. Thus, in the illustrated implementation, the high value of activation signal output 255 is approximately equal to the supply voltage $V_{supply}$ 286, whereas the low value of activation signal output 255 is approximately equal to a common voltage $V_{COM}$ 295. For example, in some implementations, the high value of activation signal output 255 can be about 25 Volts, whereas the low value of activation signal output 255 can be approximately equal to 0 Volts.

Trigger circuitry 250 includes a pair of divider resistances 256 and 258 to insert latch trigger signal on clock input C 268 of D-type flip flop 261 in latch circuit section 260. Trigger circuitry 250 is coupled to trigger soft turn-off circuitry 270 via diode 287. Trigger circuitry 250 is also coupled to trigger latch circuitry 260 via divider resistances 256 and 258.

Latch circuitry 260 includes a D-type flip flop 261 that is coupled to generate a signal 280 to latch the driver 211 of the switching controller that outputs drive signal 210 into a state that drives power switch 130 of FIG. 1 into the OFF state for a period of time. D-type flip flop 261 includes a data terminal 264, a set terminal 265, a reset terminal 266, a Q output 267, and an enable terminal 268. Enable terminal 268 can also be called a "clock" or "control" terminal.

Data terminal 264 is coupled to receive a supply signal 262. Supply signal 262 is a voltage between supply voltage $V_{supply}$ 286 and reference potential VE are adjusted to fit the voltage required by the D-type flip flop 261. In the illustrated implementation, supply signal 262 has a voltage level defined by a Zener diode 296, resistance 284, and capacitance 282. In the illustrated implementation, the anode of Zener diode 296 and one terminal of capacitance 282 are coupled to reference potential COM 295 whereas the cathode of Zener diode 296 and the other terminal of capacitance 282 are coupled to data terminal 264. Resistance 284 is coupled between supply voltage $V_{supply}$ 286 and data terminal 264.

Reference level COM 295 holds set terminal 295 in a low state so that D-type flip flop 261 responds to a rising edge that is input to enable terminal C 268 by passing supply signal 262 from data terminal 264 to Q output 267 until reset. Reset terminal 266 is coupled to reference level COM 295 via a capacitance 281 and to Q output 267 via a resistance 283. Q output 267 is coupled to the output 280 of latch circuitry 260 via a resistance 282. Q output 267 is thus coupled to a fault input of the driver 211 and/or switching controller that drives the power switch. The fault input of the driver 211 may also be denoted as desaturation DESAT or VC terminal.

Enable terminal 268 is coupled to receive a fraction of the signal on trigger activation signal output 255. In the illustrated implementation, this fraction is defined by a voltage divider formed by resistances 256, 258. When activation signal output 255 is in the high state (i.e., nearly equal to supply voltage $V_{supply}$ 286), the fraction of trigger activation signal output 255 received by enable terminal 268 is sufficient to enable latch 261. When activation signal output 255 is in the low state, (i.e., nearly equal to reference level COM 295), the fraction of trigger activation signal output 255 received by enable terminal 268 is insufficient to enable latch 261. In this disabled state, latch 261 is locked with a low signal on Q output 267.

In operation, D-type flip flop 261 outputs a low signal on Q output 267 until a rising edge is input into enable terminal 268. With enable terminal 268 coupled to receive a fraction of activation signal output 255, such a rising edge corresponds to the (diode-dropped and low-pass filtered) current sense signal on non-inverting input 253 of comparator 261 transitioning above the overcurrent threshold signal on inverting input 252.

In response to this transition, D-type flip flop 261 passes supply signal 262 from data terminal 264 to Q output 267. Q output 267 thus rises to a level sufficient to trigger a desaturation or fault response of a driver 211 and/or switching controller to which Q output 267 is coupled. Q output 267 also begins a slower process of charging reset terminal 266 with a time constant that is set by the magnitudes of resistance 283 and capacitance 281. Once reset terminal 266 rises to a level sufficient to reset D-type flip flop 261, the provision of supply signal 262 to Q output 267 is halted, as is the desaturation or fault response of the driver 211 and/or switching controller.

In some implementations, $V_{supply}$ 286 is produced by a DC/DC converter (not shown) on a power module and acts as a positive supply voltage for both a driver 211 and soft shutdown circuitry.

Soft turn-off circuitry 270 includes a soft shutdown gating transistor 275 and a diode 273. Soft shutdown gating transistor 275 includes a first main terminal coupled to the gate terminal of one or more power semiconductor switches by diode 273 and coupling output 272. Soft shutdown gating transistor 275 also includes a second main terminal coupled to reference potential VE 290 and a control terminal that is coupled to the trigger signal on output 255 of comparator 261 via diode 287 and resistance 278. Diode 287 and resistances 276, 278 generate a control signal 274 on control terminal of the soft shutdown gating transistor 275. Resistance 276 is coupled between the control terminal of soft shutdown gating transistor 275 and the reference potential VE 290. The control terminal of soft shutdown gating transistor 275 thus varies between the supply voltage $V_{supply}$ 286 when the current sense signal 253 is higher than the overcurrent threshold signal and the reference potential VE when the current sense signal 253 is lower than the overcurrent threshold signal.

Soft shutdown gating transistor 275 responds to the high value on its control terminal (indicative of detection of an overcurrent) by conducting a relatively larger portion of the current in gate drive signal 210 away from gate terminal G1 223. Soft shutdown gating transistor 275 slowly transitions the power semiconductor switch (e.g., 130 in FIG. 1) from the more conductive ON state to the less conductive OFF state when current sense signal Isns 224 is above the overcurrent threshold signal. Soft shutdown gating transistor 275 responds to the low value on its control terminal by not conducting (or conducting a small portion of) the current in gate drive signal 210 away from gate terminal G1 223 and pulling it down to reference potential VE. Diode 288, which is coupled between Q output 267 of D-type flip-flop 261 and the control terminal of soft shutdown gating transistor 275, is an alternate path for biasing soft shutdown gating transistor 275 to conduct current away from gate terminal G1 223 and pull it down to reference potential VE.

Diode 288 acts as a blanking mechanism to ensure that soft shutdown gating transistor 275 conducts current away from gate terminal G1 223 for the entire duration that a desaturation or fault signal is presented to the driver 211 and/or switching controller. Such a blanking mechanism may be helpful in circumstances, e.g., where the current sense signal Isns 224 rises above the threshold set by overcurrent threshold signal 252 and then rapidly falls below that same threshold. Without diode 288 ensuring that soft shutdown gating transistor 275 is latched and conducting current away from gate terminal G1 223 for the entire duration that Q output 267 of D-type flip-flop 261 is high, a desaturation or fault condition could be signaled to the driver 211 and/or switching controller even when the whole of gate drive signal 210 is provided to gate terminal G1 223. This could potentially lead to damage and/or destruction of a component.

Figure 2B:
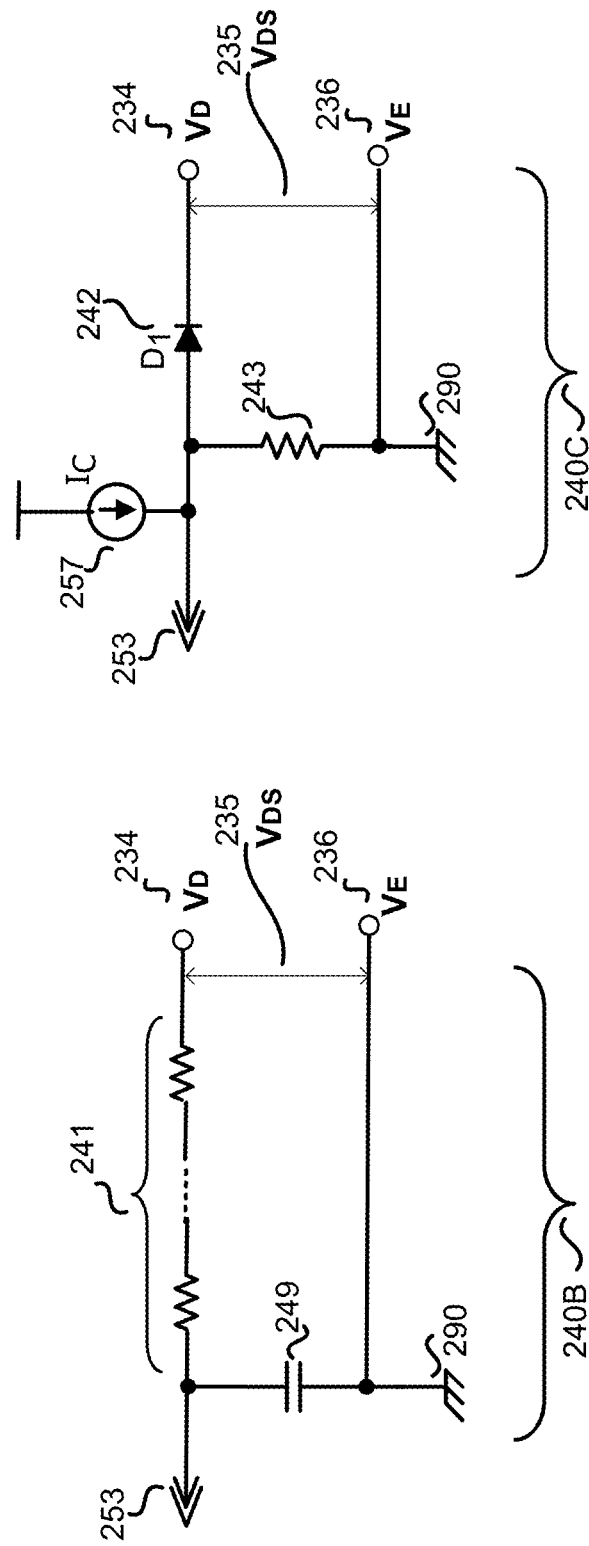
FIG. 2B shows two other circuit options detecting fault condition through the desaturation voltage across the power semiconductor switch that could replace the current detection circuit in FIG. 2A.

FIG. 2B shows two other circuit options detecting fault condition through the desaturation voltage across the power semiconductor switch that could replace the current detection circuit in FIG. 2A.

As described in FIG. 1B, the on-time voltage across the switch (e.g; $V_{DS}$ for MOSFET or $V_{CE}$ for IGBT) can also be sensed to detect an over current or short circuit condition. Different options are available to detect this on-time voltage. For example, FIG. 2B schematically represents two example circuits that are designed to withstand the high off-time voltage across the switch. In the first example (FIG. 2B, left hand side) block 240B may be used in place of block 240A of FIG. 2A. The voltage across the power switch borne across one or more resistances 214 and a capacitance 249. A voltage signal 253 across the capacitance 249 is output to comparator 251 (FIG. 2A). In another example (FIG. 2B, right hand side), the cathode of a high voltage diode D1 242 is coupled to the drain/collector of the power switch. The anode of diode D1 242 is coupled to a current supply 257 and to source reference potential VE 236 via a shunt resistor 243. During the off-time of the power switch, the anode voltage is high and diode D1 242 is reverse biased. The current output from current supply 257 leads to a voltage on shunt resistor 243 and a signal 253 is output to comparator 251 (FIG. 2A).

Whenever a short-circuit or other overload condition exists during the on-time of the power switch, the drain voltage $V_D$ drops below a threshold set by the voltage across shunt resistor 243 and the forward diode drop of D1 242. In response, diode D1 242 starts conducting, placing the power switch in parallel with the shunt resistor 243. This lowers the magnitude of voltage signal 253 output to comparator 251 and comparator 251 indicates an over current and desaturation condition. It is appreciated that there is a constant fixed offset (e.g; 10V) applied between the reference nodes VE 290 and COM 295 to make it possible compare signals referenced to VE 290 with signals referenced to COM 295.

Figure 3:
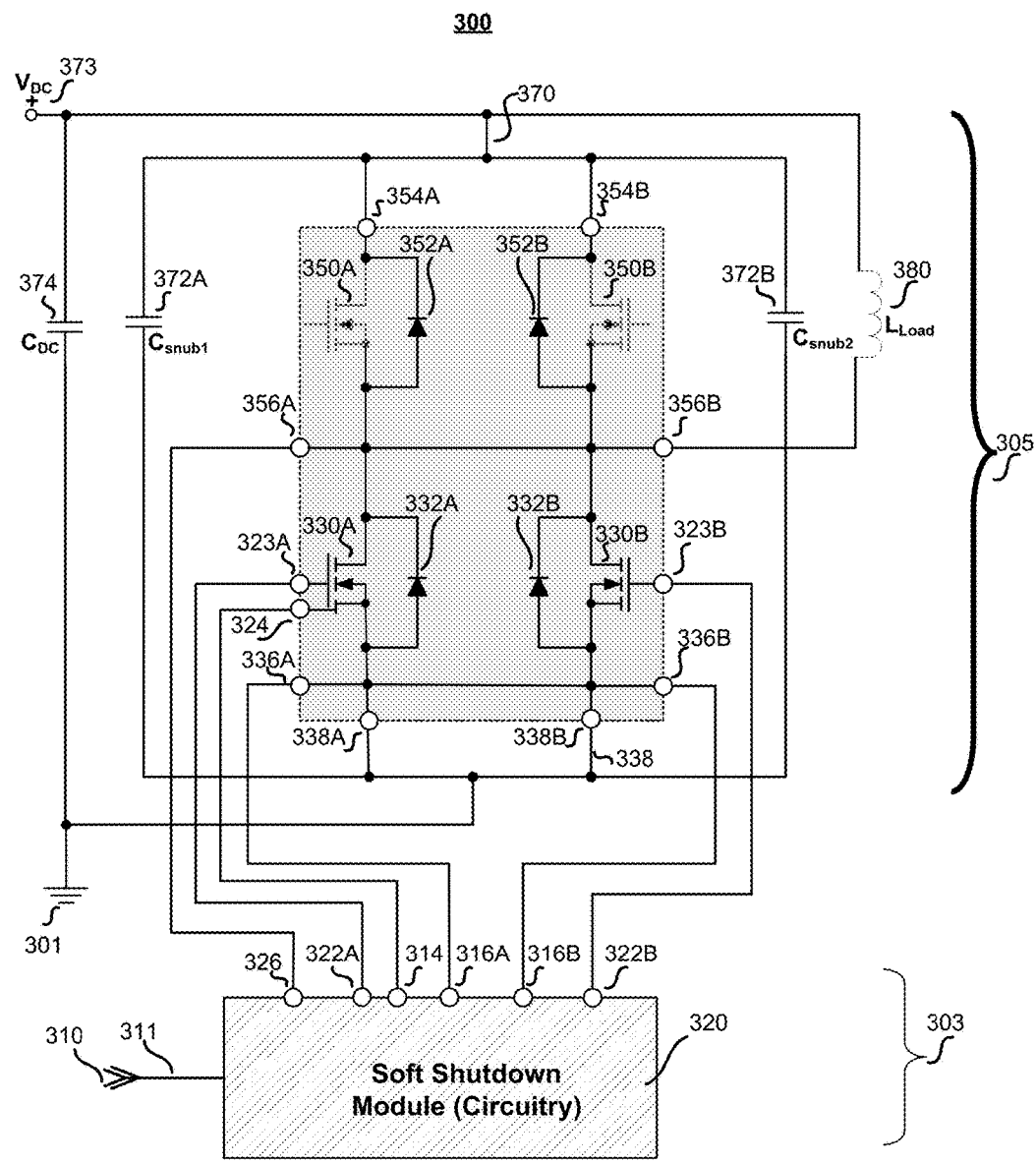
FIG. 3 is a schematic representation of deployment of soft shutdown circuitry in an example power converter with multiple power switches.

FIG. 3 is a schematic 300 representing deployment of soft shutdown circuitry in an example power converter. In the illustrated implementation, soft shutdown circuitry is added to the power converter that includes a multi-switch half-bridge inverter module 305 and a switching controller (not shown) that provides gate drive signal 310.

In the illustrated implementation, the interface between the drive signal 310 from the switching controller to the half-bridge inverter module 305 includes a soft shutdown circuitry 320. Soft shutdown circuitry 320 can be a discrete module 320 that can be combined with a variety of different power switches and switching controllers. For example, in some implementations, soft shutdown circuitry 320 can be a discretely packaged integrated circuit that includes a collection of electrical terminals. As another example, soft shutdown circuitry 320 can be assembled, e.g., on a discrete circuit board. In some implementations, soft shutdown circuitry 320 may include a housing (e.g., a weather-proof housing) that includes bulkhead or other connectors forming electrical connections to elements outside the housing. The soft shutdown functionality can thus be combined with power switch(es) and/or switching controller circuitry that were not fabricated with internal soft shutdown circuitry.

In the illustrated implementation, soft shutdown circuitry 320 includes an input 311 that is coupled to receive gate drive signal 310. Gate drive signal 310 is conducted through module 320 and at least a portion of gate drive signal 310 exits module 320 via one or more outputs 322A, 322B that are coupled to one or more gate terminals of one or more power switches 330A, 330B. In the illustrated implementation, there are two outputs of module 320 that are coupled to gate terminals, namely, a first output 322A that is coupled to the gate terminal of a first power switch 330A and a second output 322B that is coupled to the gate terminal of a second power switch 330B. In the case of an overcurrent condition, soft shutdown circuitry 320 diverts a portion of gate drive signal 210 away from the gates of power switches 330A, 330B to ensure that the turn-OFF of power switches 330A, 330B proceeds sufficiently slowly.

In the illustrated implementation, soft shutdown circuitry 320 also includes a current sense terminal 324 and multiple source reference terminals (labeled 336A, 336B, 338A and 338B in the illustrated implementation). In the illustrated implementation, current sense terminal 324 is coupled to a tap element of the power semiconductor switch 330 to measure current in one of the multiple paralleled switches.

In the illustrated implementation, the current sense terminal 324 on the switching module 305 is coupled to current sense terminal 314 on soft shutdown circuitry 320 to sense the current that flows through one of the semiconductor switches 330A, 330B. In some implementations, the current sense terminal 314 coupled to terminal 324 of semiconductor switch 330A may be coupled to a current sense finger transistor within any of semiconductor switches 330A, 330B of the switching module.

In the illustrated implementation, soft shutdown circuitry 320 also includes a mid-bridge terminal 326 that is coupled to terminals 356A, 356B of half-bridge inverter switching module 105. Thus, the mid-bridge terminal 326 that is coupled to drain terminals of the low side MOSFET switching elements may provide a reference so that the voltage drop across semiconductor switches 330A, 330B can be detected.

In the illustrated implementation, half-bridge inverter module (section 305) includes low side power switches 330A, 330B with their associated anti-parallel diodes 332A, 332B; as well includes high side power switches 350A 350B with their associated anti-parallel diodes 352A, 352B. High side power switches 350A 350B and the associated anti-parallel diodes 352A, 352B are coupled between a relatively high voltage DC source and load connection nodes 356A, 356B. When power switches 350A 350B are in a more conductive ON state, they act to raise mid-bridge nodes 356A, 356B to the potential of DC source 373.

Power switches 330A, 330B and their associated anti-parallel diodes 332A, 332B are coupled between mid-bridge nodes 356A, 356B and a reference (ground) potential 301. When power switches 330A, 330B are in a more conductive ON state, they act to lower (pull down) mid-bridge nodes 356A, 356B to reference (ground) potential 301. Power switches 330A, 330B and 350A, 350B in the illustrated half-bridge circuitry are paralleled so that the relatively larger currents may flow through them. Anti-parallel diodes 332A, 332B, 352A, 352B allow current to continue flowing to inductive load 380 even when power switches 330A, 330B, 350A, 350B are in off-state.

In the illustrated implementation, power switches 350A 350B are MOSFET switches. In some implementations, switches 330A, 330B, 350A 350B of half-bridge inverter switching module 305 can be formed on a single substrate and packaged in a single integrated circuit package, as represented by the dashed rectangular line surrounding switches 330A, 330B, 350A 350B. In other implementations, power switches 330A, 330B, 350A 350B and antiparallel diodes 332A, 332B, 352A, 352B can be implemented as, e.g., IGBT switches with external diodes.

The illustrated implementation of power converter 300 also includes a capacitance $C_{DC}$ 374 and a pair of snubber capacitances $C_{snub1}$ 372A, $C_{snub2}$ 372B. Capacitance $C_{DC}$ 374 is coupled between high voltage DC source 373 and reference (ground) potential 301 and serves as a low impedance path for high frequency components, allowing them to bypass the remainder of half-bridge inverter module 305. Snubber capacitances $C_{snub1}$ 372A, $C_{snub2}$ 372B are coupled across power switches 330A, 330B, 350A 350B help suppress voltage spikes caused by transitions of switches 330A, 330B, 350A 350B between the OFF state and the ON state.

In the illustrated implementation, power converter 300 is shown as including an inductive load $L_{Load}$ 380. Load inductance $L_{Load}$ 380 is coupled between DC source 373 and mid-bridge nodes 356A, 356B. The load inductance of $L_{Load}$ 380 generally represents the output load (e.g.; motor winding); however, in over load or short circuit circumstances it may represent a very high current through a short wire or jumper with high magnetic field. When lower switches 330A, 330B are conducting, the current through $L_{Load}$ 380 flows from $V_{DC}$ 373 through one or both lower side switches (330A, 330B). High frequency components are filtered from this current by DC bypass capacitor $C_{DC}$ 374.

When the lower side switches 330A, 330B are in the less conductive OFF state, a circulating inductive current path may form through the anti-parallel diodes 352A, 352B of the upper side switches 350A, 350B. The soft shutdown circuitry described in this application may limit the turn off voltage oscillations and energy loss for the power semiconductor switches.

Without the soft shutdown functionality provided by soft shutdown circuitry 320, $L_{Load}$ 380 could cause unduly large voltage spikes across power switches 330A, 330B during a transition of power switches 330A, 330B from an ON state to an OFF state. Without soft shutdown functionality, such voltage spikes could lead to an overcurrent condition in power switches 330A, 330B and damage could result.

Figure 4A:
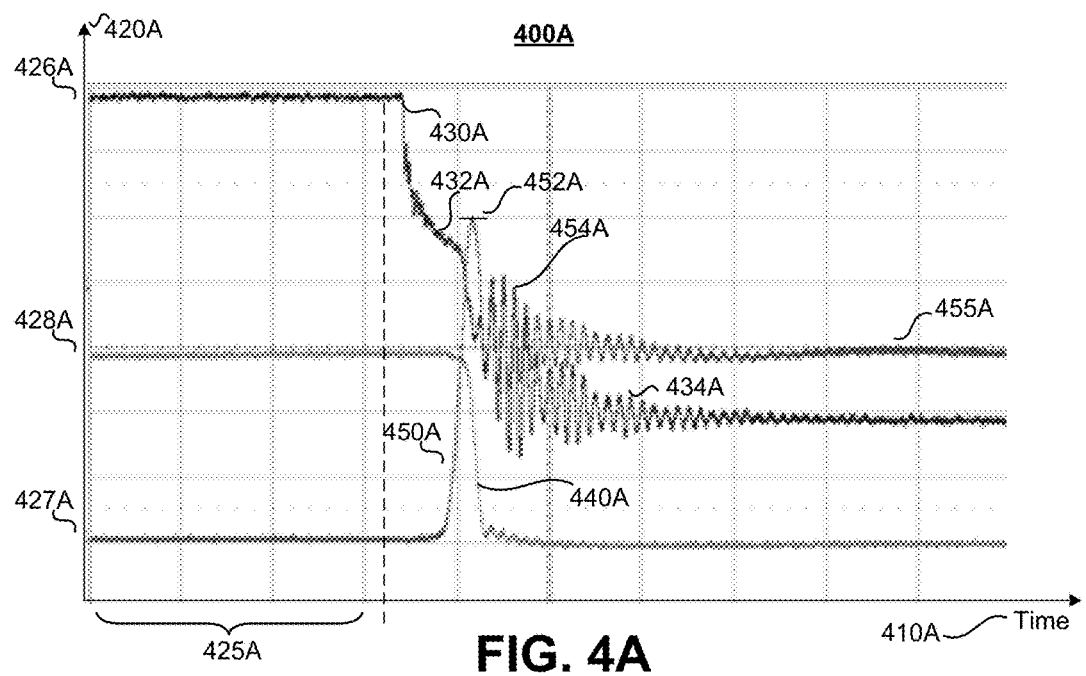
FIGS. 4A-B are examples of scope captures depicting power switch performance (voltage/current), during an over current with and without a dynamic SSD per embodiments of the present application.
Figure 4B:
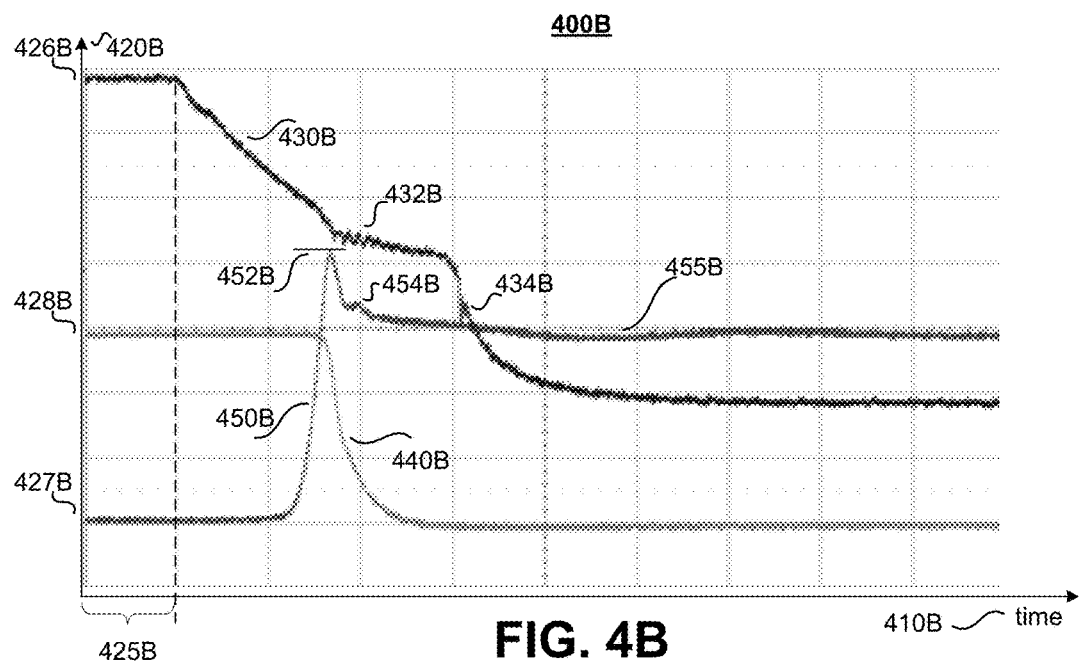

FIG. 4A is a scope capture 400A illustrating the turn-off transition of a power switch during an over current condition without soft shutdown circuitry. FIG. 4B is a scope capture 400B illustrating the turn-off transition of a power switch during the similar over current condition with soft shutdown circuitry as a function of time 410. Scope capture 400A includes a gate-to-source voltage trace 430A, a source current trace 440A, and a drain-to-source voltage trace 450A on vertical axis 420A versus time 410A on horizontal axis. Gate-to-source voltage trace 430A is shown at significantly higher voltage resolution (i.e., 5 V/div) than drain-to-source voltage trace 450 (i.e., 200 V/div). Source current trace 440A is shown at a resolution sufficient to capture the change in source current during the over current or short circuit turn-off transition, i.e., 500 A/div. As shown, at times 425A prior to the beginning of the transition to the OFF state, the gate-to-source voltage is at a voltage level 426A sufficient to maintain the power switch in a conductive ON state. As a result, the drain-to-source voltage is at a low level 427A that reflects the magnitude 428A of the source current and internal characteristics (primarily, $R_{DSON}$) of the power switch at time duration of 425A.

However, once turn-off is initiated, gate-to-source voltage trace 430A starts to drop and eventually reaches a Miller plateau 432A. The Miller plateau 432A reflects the delay associated with charging the intrinsic gate to drain capacitance of the power switch. Despite this delay, the turn-off of the power switch remains relatively rapid and the drain-to-source voltage 450A rises to a level 452A that is significantly above the potential difference 455A between the drain and the source after the transient effects are damped. Further, the drain-to-source voltage 450A includes significant ringing oscillations 454A and the gate-to-source voltage 430A also includes ringing oscillations 434A, both of which are capable of damaging the power switch and/or associated circuitry.

In contrast, in scope capture 400B of FIG. 4B (which illustrates the turn-off transition under similar over current condition with soft shutdown circuitry) drain-to-source voltage 450B rises to a level 452B that—although it remains higher than the potential difference 455B between the drain and the source after the transient effects are damped—is much lower than the level 452A reached without soft shutdown circuitry in FIG. 4A. Further, the ringing oscillations 434B, 454B in both the gate-to-source voltage 430B and the drain-to-source voltage 450B have been reduced significantly in amplitude (negligible), reducing the likelihood that the power switch and/or associated circuitry is damaged.

Figure 4C:
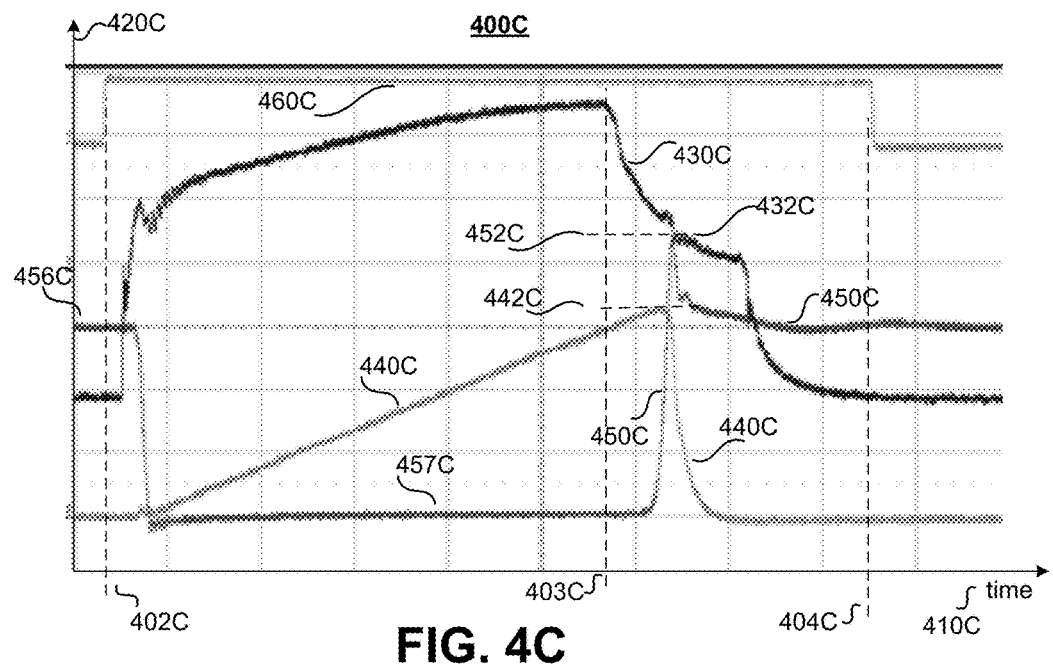
FIG. 4C is a scope capture illustrating the turn-off transition of a power switch in the presence of an external short circuit through a wire with relatively high inductance with soft shutdown circuitry as a function of time.
Figure 4D:
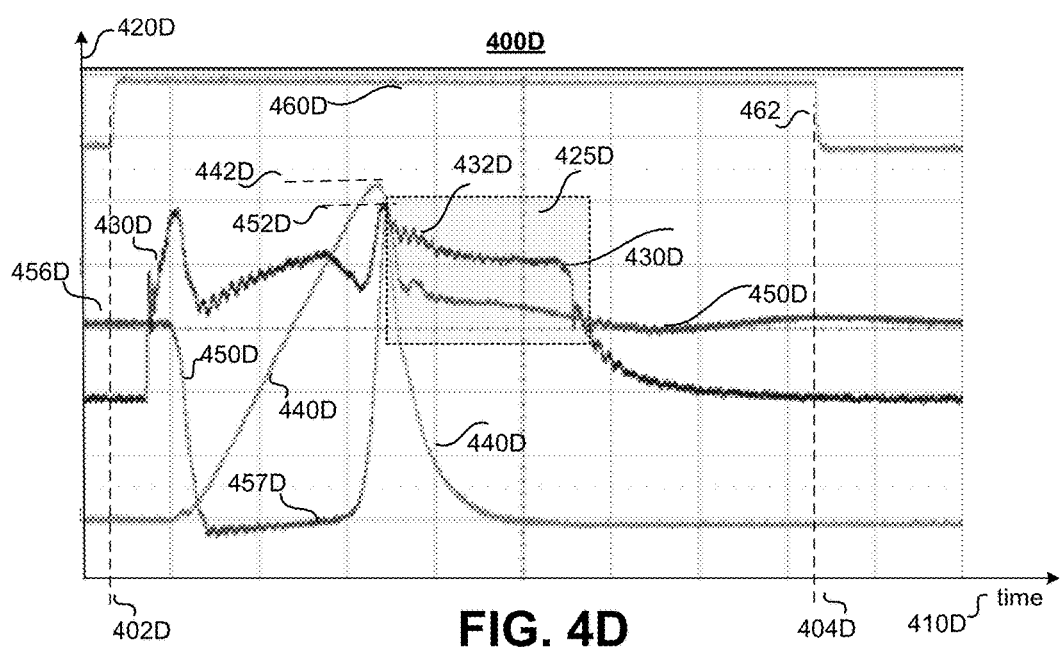
FIG. 4D is a scope capture illustrating the turn-off transition of a power switch in the presence of an external short circuit through a wire with relatively small inductance with soft shutdown circuitry as a function of time.

FIG. 4C is a scope capture 400C illustrating the turn-off transition of a power switch in the presence of an external short circuit through an inductive wire (e.g; 2 uH) with soft shutdown circuitry activation and FIG. 4D is a scope capture 400D illustrating the turn-off transition of a power switch in the presence of an external short circuit through a very short wire (jumper, e.g; 0.2 uH) with the soft shutdown circuitry activation as a function of time 410C, 410D.

Scope captures 400C, 400D each include an input drive signal trace 460C, 460D in addition to a gate-to-source voltage trace 430C, 430D, a source current trace 440C, 440D, and a drain-to-source voltage trace 450C, 450D. Input drive signal traces 460C, 460D are shown with a resolution of 10 V/div while gate signal trace 430C, 430D are in scale of 5 V/div and drain voltage traces 450C, 450D are with 200 V/div resolutions.

Drive signal traces 460C, 460D represent/simulate the drive signal output by driver circuitry of a switching controller. In both scope captures 400C, 400D, after applying the short circuit wire/jumper, drive signal trace 460C or 460D transitions from a low state to a high state at time 402 and from the high state back to the low state at time 404. The high state of the drive signal is supposed to maintain a power switch in a more conductive ON state for the duration between times 402, 404 in the absence of the external short circuit. However, due to presence of the applied short circuit, the source current traces 440C, 440D rise to an activation threshold of soft shutdown circuitry to turn off the power switch.

As shown in scope capture 400C, shortly after time 402C, the gate-to-source voltage trace 430C rises to a level sufficient to allow drain-to-source voltage 450C to drop from a level 456C to a level 457C. In the absence of a fault and in the presence of an ideal resistive load, both the gate-to-source voltage 430C and the magnitude of the source current 440C would remain at a steady level until the power switch is transitioned from the more conductive ON state to a less conductive OFF state in the vicinity of time 404C. However, with the short circuit present, the source current 440C continues to rise with a nearly linear slope from a leakage current value (essentially, zero) up to a maximum value 442C of more than 1500 Amperes. This large current changes the internal characteristics of the power switch. Gate-to-source voltage 430C continues to rise until a turn-OFF transition is triggered at time 403 when the gate-to-drain (Miller) capacitance starts charging. Due to the turn-off (propagation) delay, current trace 440C may increase further (e.g; up to ~1650 A) before dropping to zero. In the illustrated implementation, the drain-to-source voltage 450C rises to a maximum level 452C.

Scope capture 400D in FIG. 4D shows the impact of soft shutdown circuitry activation in presence of the 0.2 uH inductance jumper short circuit). Shortly after the time 402D at which the drive signal is applied, the gate-to-source voltage trace 430D rises to a level sufficient to allow drain-to-source voltage $V_{DS}$ 450D to drop from a level 456D to a level 457D. In the absence of a solid short circuit fault and in the presence of an ideal resistive load, both the gate-to-source voltage 430D and the magnitude of the source current 440D would remain at a steady level until the power switch is transitioned from the more conductive ON state to a less conductive OFF state in the vicinity of time 404D. However, with the short circuit present, the source current 440D continues to rise rapidly with a nearly linear slope from a leakage current value (essentially, zero) up to a maximum value 442D of more than 2500 Amperes. The higher maximum value 442D in scope capture 400D compared to 400C is due to the solid jumper short circuit rather than a short circuit through a wire with limited inductance (i.e., 0.2 uH compared to 2 uH).

The relatively larger slope of the rising current in scope capture 400D (i.e., compared with scope capture 400C) gives rise to a number of different phenomena, including the differences between gate-to-source voltage 430D and gate-to-source voltage 430C. The gate-to-source voltage 430D does not reach the same level as gate-to-source voltage 430C. Also, gate-to-source voltage 430D starts to drop before the time 404D when a turn-OFF transition is triggered. After the turn-OFF transition is triggered, the power switch turns off (naturally, with some propagation delay) and source current 440D drops towards zero. Further, drain-to-source voltage $V_{DS}$ 450D rises to a maximum level 452D.

Highlighted window 425D shows start of the actual turn-off process. The trace changes in the highlighted window 425D in FIG. 4D are due to the very high rate of change in the short circuit current (high $di_L/dt$). In particular, the rapid changes in the short circuit current impact the gate-to-drain Miller capacitance of the power semiconductor switch. Due to this effect, the gate-source voltage may drop, then increase, and then drop again before increasing at the start of Miller plateau 432D.

In highlighted window 425D, the drain-to-source voltage $V_{DS}$ trace 450D increases to $V_{DS(Max)}$ 452D (e.g., 880V) before settling back (e.g., 600V) after completion of the turn-off process. As can be seen, even with this very extreme test condition, the drain-to-source voltage $V_{DS}$ trace 450D and the source current trace 440D show no turn-off oscillations and smoothly drop after their maximum points 452C (eg; 880V) or 442D (eg; 2600 A).

A number of implementations have been described. Nevertheless, various changes may be made. Accordingly, other implementations are encompassed within the scope of the appended claims.

The invention claimed is:

1. Circuitry for a soft shutdown of a power switch, the circuitry comprising:

a current sense input coupled to the power switch to receive a signal representative of current passing through the power switch;
a comparator coupled to compare the signal representative of current passing through the power switch with an overcurrent threshold indicative of an overcurrent condition of the power switch, wherein the comparator is coupled to output a triggering signal in response to the comparison indicating the overcurrent condition; and
a gating transistor coupled to the comparator and to a control terminal of the power switch, the gating transistor configured to divert a portion of a drive signal away from the control terminal of the power switch by discharging a gate capacitance of the power switch in a controlled rate;
a latch circuitry coupled to receive the triggering signal and coupled to cause a hard turn off of the power switch, the latch circuitry comprising:
a resistance coupled between an output terminal and a reset terminal of the latch circuitry; and
a timing capacitor coupled to the resistance and the reset terminal of the latch circuitry, wherein the reset terminal is coupled to receive an input signal representative of a duration of the soft shutdown of the power switch from the timing capacitor, wherein the latch circuitry is coupled to be reset in response to the input signal received from the timing capacitor.

2. The circuitry of claim 1, wherein the sense input is a voltage sense input; and
the signal representative of current passing through the power switch is a voltage sense signal representative of the potential difference between main terminals of the power switch.

3. The circuitry of claim 1, wherein the duration of the soft shutdown of the power switch is determined by the input signal in response to a time constant set by magnitudes of the timing capacitor and the resistance such that the gating transistor is latched to divert the portion of the drive signal away from the control terminal for the duration of the soft shutdown of the power switch.

4. The circuitry of claim 1, wherein the latch circuitry is a D-type flip flop.

5. The circuitry of claim 1, wherein the circuitry for soft shutdown of a power switch is modular.

6. The circuitry of claim 5, wherein the circuitry for soft shutdown is packaged in an integrated circuit package that is discrete from the power switch and driver circuitry that outputs the drive signal.

7. The circuitry of claim 5, wherein the circuitry for soft shutdown is assembled on a circuit board that is discrete from the power switch and driver circuitry that outputs the drive signal.

8. The circuitry of claim 1, wherein the controlled rate is a rate to produce ringing oscillations, having a negligible amplitude, in a drain-to-source voltage of the power switch.

9. The circuitry of claim 1, wherein the hard-off occurs after an intrinsic delay.

10. The circuitry of claim 1, wherein the intrinsic delay is substantially 1.5 microseconds.

* * * * *